(12) United States Patent
Van De Ven et al.

(10) Patent No.: US 12,197,139 B2
(45) Date of Patent: Jan. 14, 2025

(54) OBJECT HOLDER, TOOL AND METHOD OF MANUFACTURING AN OBJECT HOLDER

(71) Applicant: ASML NETHERLANDS B.V., Veldhoven (NL)

(72) Inventors: Bastiaan Lambertus Wilhelmus Marinus Van De Ven, Rosmalen (NL); Johannes Bernardus Charles Engelen, 's-Hertogenbosch (NL); Arnoud Willem Notenboom, Rosmalen (NL); Jim Vincent Overkamp, Eindhoven (NL); Kjeld Gertrudus Hendrikus Janssen, Nijmegen (NL); Johannes Adrianus Cornelis Maria Pijnenburg, Moergestel (NL); Jeroen Van Duivenbode, Veldhoven (NL); Erik Johannes Nieuwenhuis, Eindhoven (NL); Koos Van Berkel, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/802,841

(22) PCT Filed: Feb. 25, 2021

(86) PCT No.: PCT/EP2021/054692
§ 371 (c)(1),
(2) Date: Aug. 26, 2022

(87) PCT Pub. No.: WO2021/185552
PCT Pub. Date: Sep. 23, 2021

(65) Prior Publication Data
US 2023/0105002 A1    Apr. 6, 2023

(30) Foreign Application Priority Data
Mar. 16, 2020    (EP) ..................................... 20163373

(51) Int. Cl.
*G03F 7/00* (2006.01)

(52) U.S. Cl.
CPC ...... *G03F 7/70708* (2013.01); *G03F 7/70716* (2013.01); *G03F 7/70775* (2013.01)

(58) Field of Classification Search
CPC ............ G03F 7/70708; G03F 7/70716; G03F 7/70775; H01L 21/6833; H01L 21/6875;
(Continued)

(56) References Cited

U.S. PATENT DOCUMENTS 4,502,094 A * 2/1985 Lewin ................. H01L 21/6831
                                                        118/500
2007/0103666 A1    5/2007 Ottens et al.
(Continued)

FOREIGN PATENT DOCUMENTS

JP    2001068536    3/2001
JP    2002134599    5/2002
(Continued)

OTHER PUBLICATIONS

International Search Report and Written Opinion issued in corresponding PCT Patent Application No. PCT/EP2021/054692, dated May 21, 2021.
(Continued)

*Primary Examiner* — Deoram Persaud
(74) *Attorney, Agent, or Firm* — Pillsbury Winthrop Shaw Pittman, LLP

(57) ABSTRACT

An object holder configured to support an object, the object holder including: a core body comprising a plurality of burls having distal ends in a support plane for supporting the object; and an electrostatic sheet between the burls, the electrostatic sheet comprising an electrode sandwiched
(Continued)

between dielectric layers, wherein the electrostatic sheet is bonded to the core body by a bonding material having a thickness of at least 100 nm.

20 Claims, 9 Drawing Sheets

(58) Field of Classification Search
CPC ......... H01L 21/68757; H01L 21/68785; G06F 3/16; G10L 19/008; H04L 65/612; H04L 65/70; H04L 65/75; H04L 65/765; H04L 65/80; H04S 1/00; H04S 1/002; H04S 1/007; H04S 2400/01; H04S 2400/03; H04S 2400/07; H04S 2400/11; H04S 2420/01; H04S 2420/03; H04S 3/00; H04S 3/004; H04S 3/008; H04S 5/00; H04S 7/00; H04S 7/303; H04S 7/305; H04S 7/306; H04S 7/308
See application file for complete search history.

(56) References Cited

U.S. PATENT DOCUMENTS

| | | |
|---|---|---|
| 2011/0222033 A1 | 9/2011 | Ten Kate et al. |
| 2012/0274920 A1 | 11/2012 | Bex et al. |
| 2013/0094009 A1 | 4/2013 | Lafarre et al. |
| 2013/0321788 A1 | 12/2013 | Ockwell et al. |
| 2015/0124234 A1 | 5/2015 | Lafarre et al. |
| 2015/0348815 A1* | 12/2015 | Baldus .................. H02N 13/00 29/846 |
| 2016/0018744 A1 | 1/2016 | Lafarre et al. |
| 2017/0292566 A1* | 10/2017 | Tromp ................ H01L 21/6833 |
| 2020/0013660 A1 | 1/2020 | Kubatz |
| 2020/0321233 A1* | 10/2020 | Ziegenhagen ...... G03F 7/70708 |
| 2023/0236518 A1* | 7/2023 | Van De Ven ....... G03F 7/70825 355/75 |
| 2023/0400783 A1* | 12/2023 | Steur .................. G03F 7/70733 |

FOREIGN PATENT DOCUMENTS

| | | |
|---|---|---|
| JP | 2010205813 | 9/2010 |
| JP | 2012235095 | 11/2012 |
| JP | 2016519332 | 6/2016 |
| JP | 2020010037 | 1/2020 |
| WO | 2014/154428 | 10/2014 |
| WO | 2015/120923 | 8/2015 |

OTHER PUBLICATIONS

Office Action issued in corresponding Japanese Patent Application No. 2022-550909, dated Nov. 15, 2024.

* cited by examiner

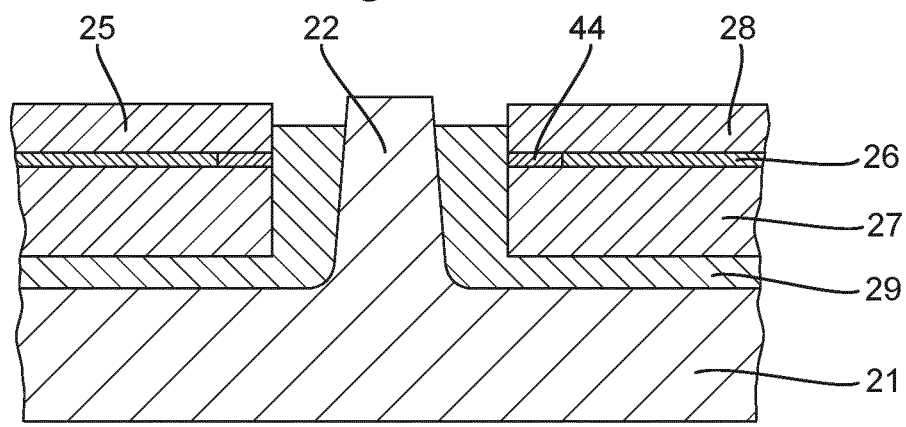
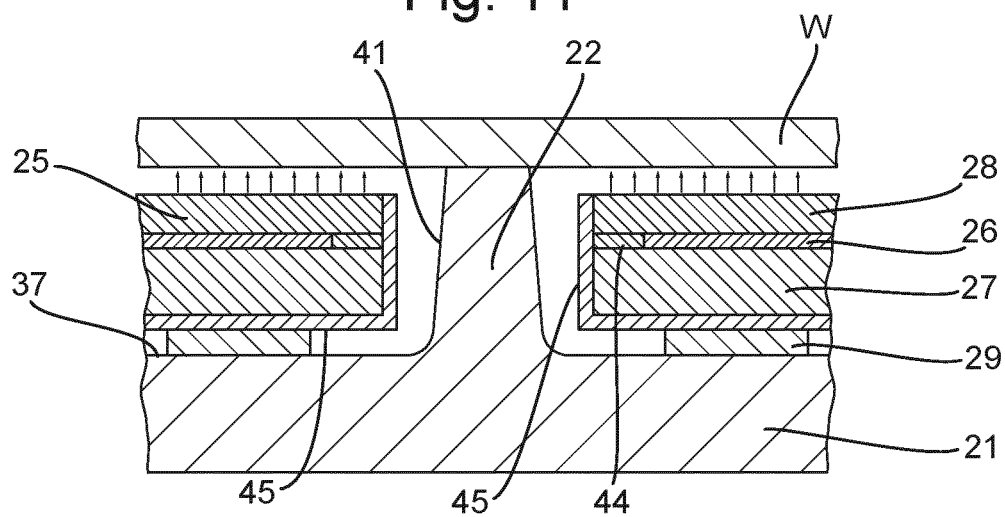
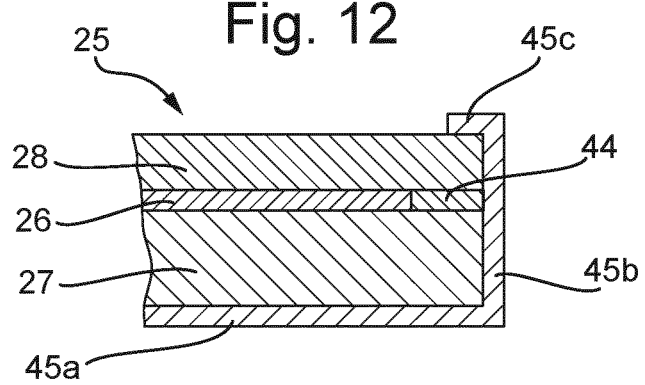

OBJECT HOLDER, TOOL AND METHOD OF MANUFACTURING AN OBJECT HOLDER

CROSS-REFERENCE TO RELATED APPLICATIONS

This application is the U.S. national phase entry of PCT Patent Application No. PCT/EP2021/054692 which was filed on Feb. 25, 2021, which claims priority of European Patent Application No. 20163373.2 which was filed on 16 Mar. 2020 and which is incorporated herein in its entirety by reference.

FIELD

The present invention relates to an object holder for use in a lithographic apparatus. More particularly, the object holder comprises an electrostatic clamp arranged to clamp the object holder to a table and/or to clamp an object to the object holder. The present invention further relates to a tool for mounting an electrostatic sheet and to a method of manufacturing an object holder.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask or reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In a conventional lithography apparatus, the substrate to be exposed may be supported by a substrate holder (i.e. the object that directly supports a substrate) which in turn is supported by a substrate table (mirror block or stage, i.e. the object such as table that supports the substrate holder and provides the upper surface surrounding the substrate holder). The substrate holder is often a flat rigid disc corresponding in size and shape to the substrate (although it may have a different size or shape). It has an array of projections, referred to as burls or pimples, projecting from at least one side. The substrate holder may have an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. The purpose of this is to help prevent a particle (i.e. a contaminating particle such as a dust particle) which might be present on either the substrate table or substrate holder from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping may therefore be used. In electrostatic clamping, a potential difference is established between the substrate, or an electrode plated on its lower surface, and an electrode provided on, or in, the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In a known arrangement, one or more electrodes may be provided on, or in, the substrate holder so that the substrate holder is clamped to the substrate table and the substrate is separately clamped to the substrate holder.

There is a need to improve substrate holders that comprise one or more electrostatic clamps for clamping a substrate holder to a substrate table and/or a substrate to a substrate holder. More generally, there is a need to improve an object holder, such as patterning device holder, that comprises one or more electrostatic clamps for holding the object holder to a table and/or holding an object against the object holder.

SUMMARY

According to a first aspect of the invention, there is provided object holder configured to support an object, the object holder comprising: a core body comprising a plurality of burls having distal ends in a support plane for supporting the object; and an electrostatic sheet between the burls, the electrostatic sheet comprising an electrode sandwiched between dielectric layers; wherein the electrostatic sheet is bonded to the core body by a bonding material having a thickness of at least 100 nm.

According to a second aspect of the invention, there is provided a tool for mounting an electrostatic sheet comprising an electrode sandwiched between dielectric layers onto a core body comprising a plurality of burls having distal ends in a support plane for supporting an object, the tool comprising: a plate comprising a plurality of recesses for respective burls, the plate configured to connect to the electrostatic sheet such that the recesses line up with respective holes in the electrostatic sheet.

According to a third aspect of the invention, there is provided a method of manufacturing an object holder, the method comprising: providing a core body comprising a plurality of burls having distal ends in a support plane for supporting an object; connecting an electrostatic sheet to a plate comprising a plurality of recesses for respective burls, such that the recesses line up with respective holes in the electrostatic sheet, the electrostatic sheet comprising an electrode sandwiched between dielectric layers; and controlling movement of the plate when the electrostatic sheet is connected so as to mount the electrostatic sheet onto the core body between the burls, a depth of the recesses determining a height at which the electrostatic sheet is mounted.

BRIEF DESCRIPTION OF THE DRAWINGS

Embodiments of the invention will now be described, by way of example only, with reference to the accompanying schematic drawings, in which:

FIGS. 10 and 11 are close-up views of parts of object holders according to alternative embodiments of the invention;

FIG. 12 schematically shows different possible positions of electrostatic shielding of an electrostatic sheet of an object holder according to an embodiment of the invention;

Figure 1:
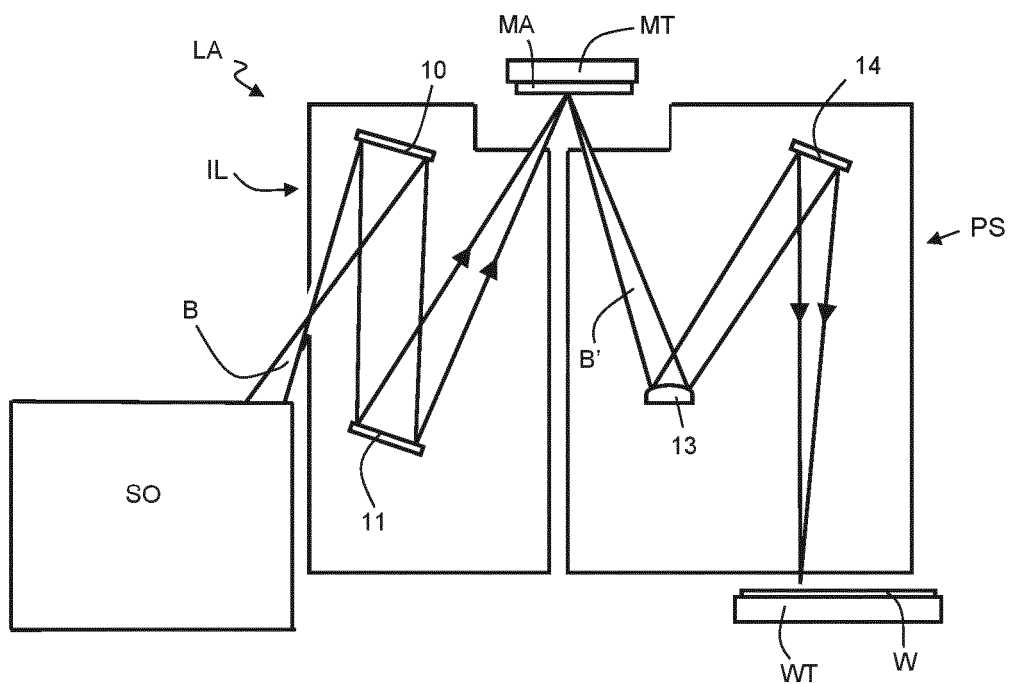
FIG. 1 depicts a lithographic system comprising a lithographic apparatus and a radiation source.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask or reticle), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 2:
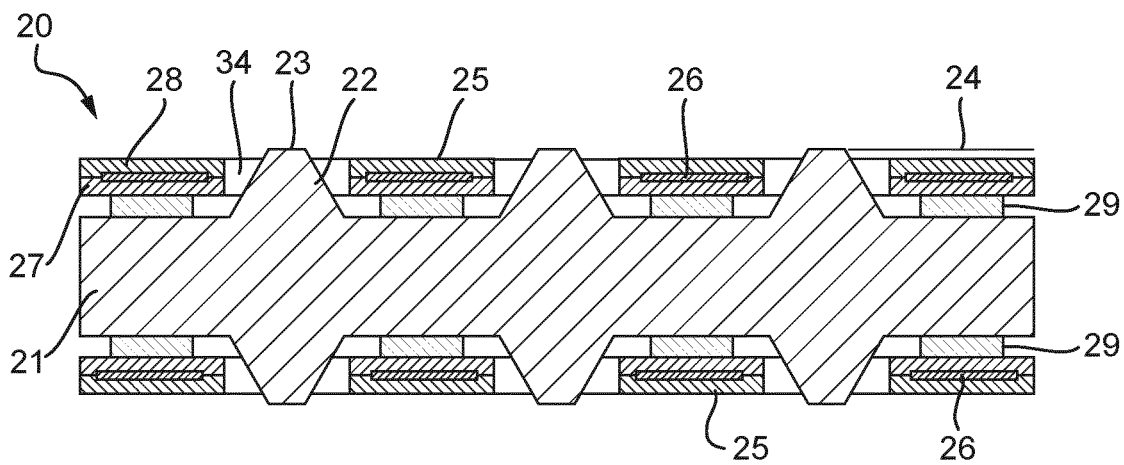
FIG. 2 is a cross-sectional view of an object holder according to an embodiment of the invention.

FIG. 2 is a cross-sectional view of an object holder 20 according to an embodiment of the invention. The object holder 20 is configured to support an object. In the description below, the invention will be described in a context of the object holder being a substrate holder 20 that is configured to support a substrate W. However, the object holder is not limited to such a substrate holder 20. For example, the object holder may be configured to support a patterning device MA.

In an embodiment, the substrate Table WT comprises the substrate holder 20 and a substrate stage. The substrate stage comprises a recess into which the substrate holder 20 is held. The substrate holder 20 is configured to hold the substrate W relative to the substrate stage of the substrate table WT.

As shown in FIG. 2, in an embodiment the substrate holder 20 comprises a core body 21. The core body 21 is a plate-like disk. As shown in FIG. 2, in an embodiment the core body 21 comprises a plurality of burls 22. The burls 22 are protrusions protruding at the surface of the core body 21. As shown in FIG. 2, in an embodiment the burls 22 have distal ends 23. The core body 21 is configured such that the distal ends 23 are in a support plane 24 for supporting the substrate W. The underside of the substrate W comes into contact with the distal ends 23 of the burls 22. The position of the underside of the substrate W corresponds to the support plane 24. The burls 22 are arranged so that the substrate W lies generally flat on the substrate holder 20.

The burls 22 are not shown to scale in FIG. 2. In a practical embodiment, there can be many hundreds, thousands, or tens of thousands, of burls distributed across a substrate holder 20 of diameter, e.g., 200 mm, 300 mm or 450 mm. The tips of the burls 22 have a small area, e.g. less than 1 mm2, so that the total area of all of the burls 22 on one side of the substrate holder 20 is less than about 10% of the total area of the total surface area of the substrate holder 20. Because of the arrangement of burls 22, there is a high probability that any particle that might lie on the surface of the substrate W, substrate holder 20 or substrate table WT will fall between burls 22 and will not therefore result in a deformation of the substrate W or substrate holder 20. The burl arrangement, which may form a pattern, can be regular or can vary as desired to provide appropriate distribution of force on the substrate W and substrate table WT. The burls 22 can have any shape in plan but are commonly circular in plan. The burls 22 can have the same shape and dimensions throughout their height but are commonly tapered. The burls 22 can project a distance of from about 1 μm to about 5 mm, desirably from about 5 μm to about 250 μm, desirably about 10 μm above the rest of the object-facing surface of the substrate holder 20 (i.e. the top surface of the electrostatic sheet 25). Hence, the distance between the distal ends 23 of the burls 22 and the top surface of the electrostatic sheet 25 in the vertical direction is from about 1 μm to about 5 mm, desirably from about 5 μm to about 250 μm, desirably about 10 μm. The thickness of the core body 21 of the substrate holder 20 can be in the range of about 1 mm to about 50 mm, desirably in the range of about 5 mm to 20 mm, typically 10 mm.

The core body 21 may be made of rigid material. Desirably the material has a high thermal conductivity or a low coefficient of thermal expansion. Desirably the material is electrically conductive. Desirably the material has a high hardness. A suitable material includes SiC (silicon carbide), SiSiC (siliconized silicon carbide), Si3N4 (silicon nitrite), quartz, and/or various other ceramic and glass-ceramics, such as Zerodur™ glass ceramic. The core body 21 can be manufactured by selectively removing material from a solid disc of the relevant material so as to leave the projecting burls 22. A suitable technique to remove material includes electrical discharge machining (EDM), etching, machining and/or laser ablation. The core body 21 can also be manufactured by growing burls 22 through a mask. The burls 22 may be of the same material as the base and can be grown by a physical vapor deposition process or sputtering. In an embodiment, the core body 21 comprises one or more internal channels (not shown in the Figures). In an embodiment, the core body 21 comprises a plurality of layers that are bonded together. In an embodiment, the layers are formed of different materials. Merely as one example, in an embodiment the core body 21 comprises a layer of SiSiC, a layer of glass and another layer of SiSiC in that order. Other combinations of layers are also possible.

As shown in FIG. 2, in an embodiment the substrate holder 20 comprises one or more electrodes 26 for an electrostatic clamp. A potential difference may be generated in order to provide an electrostatic clamping force between the substrate W and the substrate holder 20 and/or between the substrate holder 20 and the substrate stage of the substrate table WT. In an embodiment, the electrodes 26 are encapsulated between dielectric layers (also known as electrical isolation layers) 27, 28. The potential difference generated may be of the order of 10 to 5,000 volts. Arrangements using one or more heaters and temperature sensors to locally control the temperature of a substrate are described in U.S. publication no. 2011-0222033, which is incorporated herein by reference in its entirety and the techniques therein may be applied to the techniques herein.

As shown in FIG. 2, in an embodiment the substrate holder 20 comprises an electrostatic sheet 25. The electrostatic sheet 25 comprises one or more electrodes 26. For the electrodes 26, in an embodiment two halves of continuous metal film (but isolated from the distal ends 23 of the burls 22) may be separated by a separation distance from each other and deposited to form positive and negative elements of the electrostatic clamp. The separation distance is not particularly limited. In an embodiment the separation distance is at least about 20 μm, optionally at least about 50 μm, optionally at least about 100 μm, optionally at least about 200 μm, and optionally at least about 500 μm. In an embodiment the separation distance is at most about 2 mm, optionally at most about 1 mm, and optionally at most about 500 μm. In an embodiment the separation distance is about 500 μm. There may therefore be two electrodes 26. However, the number of electrodes 26 in the electrostatic sheet 25 is not particularly limited and may be one or three or more. Metal lines of the electrodes 26 may have a layer thickness greater than about 20 nm, desirably greater than about 40 nm. The metal lines desirably have a layer thickness less than or equal to about 1 μm, desirably less than about 500 nm, desirably less than about 200 nm.

An electrode 26 of an upper electrostatic sheet 25 may be configured to electrostatically clamp the substrate W to the substrate holder 20. An electrode 26 of a lower electrostatic sheet 25 may be configured to electrostatically clamp the substrate holder 20 to the rest of the substrate table WT.

In an embodiment the material of the core body 21 and the burls 22 is electrically conductive. For example, in an embodiment the material of the burls 22 is SiSiC. However, it is not essential for the material of the core body 21 and the burls 22 to be electrically conductive. In an embodiment, a grounding layer may be provided that electrically connects the distal ends 23 of two or more of the burls 22 (optionally all of the burls 22) to ground or a common electrical potential. The grounding layer may be formed by depositing a relatively thick layer of a conductive material. The conductive material is not particularly limited. In an embodiment the conductive material is Cr. In an alternative embodiment the conductive material is CrN. In an embodiment the deposited layer is then patterned to form the grounding layer. The pattern may comprise a series of metal lines that connect together distal ends 23 of the burls 22. Such patterns are sometimes referred to as "Manhattan" patterns. In an alternative embodiment the deposited layer is not patterned. In an embodiment the grounding layer or another layer is arranged to cover a surface of the core body 21 and/or the burls 22. The grounding layer or other layer can help to smoothen the surface to make it easier to clean the surface.

As shown in FIG. 2, in an embodiment the electrostatic sheet 25 comprises an electrode 26 sandwiched between dielectric layers 27, 28. As shown in FIG. 2, in an embodiment burls 22 and the electrostatic sheet 25 are provided on both main surfaces of the substrate holder 20. In an alternative embodiment, the burls 22 and the electrostatic sheet 25 are provided on only one of the two main surfaces of the substrate holder 20. As shown in FIG. 2, in an embodiment the electrostatic sheet 25 is between the burls 22. For example, as shown in FIG. 2, holes are 34 are provided in the electrostatic sheet 25. The holes 34 are arranged such that their position corresponds to the burls 22 of the core body 21. The burls 22 protrude through respective holes 34 of the electrostatic sheet 25 such that the electrode 26 that is sandwiched between the dielectric layers 27, 28 is provided in the region between the burls 22.

As shown in FIG. 2, in an embodiment the substrate holder 20, comprises a bonding material 29. In an embodiment, the bonding material has a thickness of at least 100 nm. The bonding material 29 secures the position of the electrostatic sheet 25 relative to the core body 21. The bonding material 29 keeps the holes 34 in the electrostatic sheet 25 aligned with the burls 22. In an embodiment, the burls 22 are positioned at the centre of respective holes 34 of the electrostatic sheet 25. By providing that the bonding material 29 has a thickness of at least 100 nm, a minimum level of compliancy of the bond layer is ensured. In general, thicker bonding material is more compliant and less sensitive to stress levels caused by temperature differences at the interface between the core body 21 and the electrostatic sheet 25. In an embodiment, the bonding material 29 has a thickness of at least 200 nm, optionally at least 500 nm, optionally at least 1 μm, optionally at least 2 μm, optionally at least 5 μm, optionally at least 10 μm, optionally at least 20 μm, optionally at least 25 μm and optionally at least 50 μm. The inventors have found that making the bonding material 29 at least 25 μm in thickness improves the tolerances of the interface parts to temperature differences (i.e. the bond layer is more compliant). In an embodiment, the bonding material 29 has a thickness of at most 100 μm. This ensures a minimum level of stability of the bonding material 29, which is beneficial for the electrostatic performance of the clamping function. In an embodiment, the bonding material 29 has a thickness of at most 75 μm, and optionally at most 50 μm. Reducing the thickness of the bonding material 29 helps to make the bonding material 29 more stable. Merely as an example, in an embodiment the bonding material 29 has a thickness in the range of from about 25 μm to about 75 μm.

As shown in FIG. 2, in an embodiment the bonding material 29 is formed in discrete portions that do not connect to each other. There may be some variation in the thickness of the different portions of bonding material 29. In an embodiment, the separate portions of bonding material 29 have substantially the same thickness as each other. As shown in FIG. 10, in an alternative embodiment the bonding material 29 extends continuously in the region between the core body 21 and the electrostatic sheet 25. As shown in FIG. 10, in an embodiment the bonding material 29 extends to the region between the electrostatic sheet 25 and the burls 22.

Figure 3:
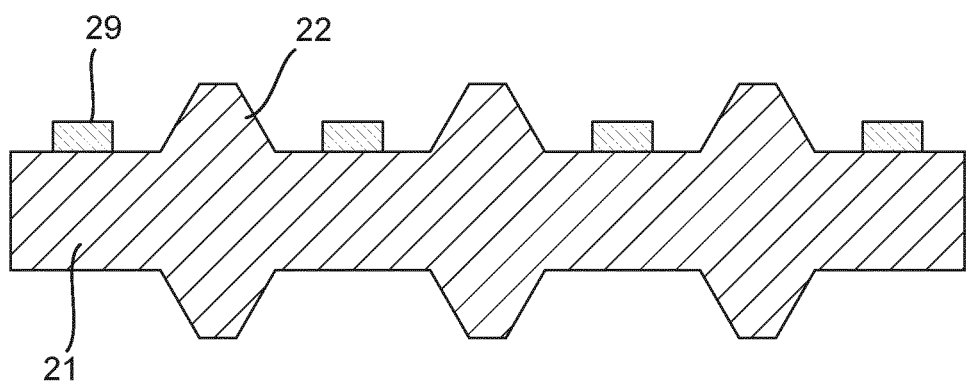
FIGS. 3-5 are cross-sectional views relating to different stages in a method of manufacturing an object holder according to an embodiment of the invention.
Figure 4:
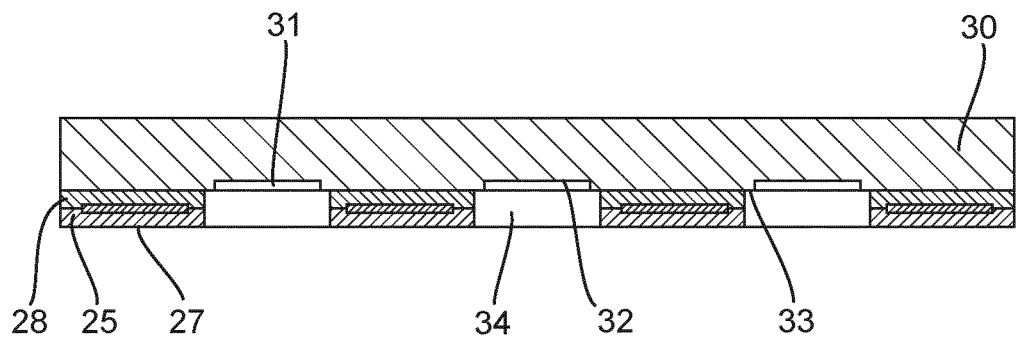
Figure 5:
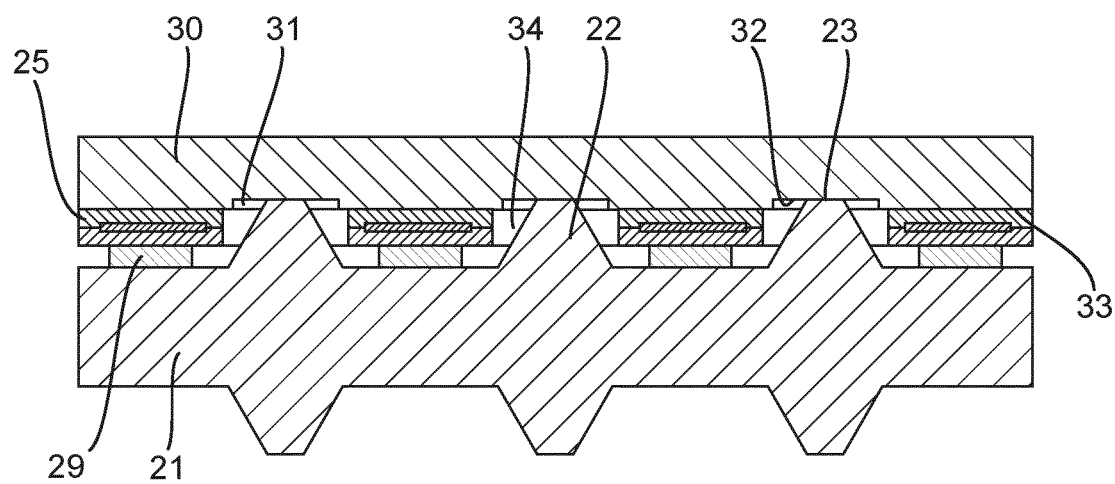

FIGS. 3-5 schematically depict successive stages of a process of manufacturing the substrate holder 20. In particular, FIGS. 3-5 show stages of joining the electrostatic sheet 25 to the core body 21.

As shown in FIG. 3, in an embodiment the method of manufacturing the substrate holder 20 comprises providing a core body 21. The core body 21 comprises a plurality of burls 22 for supporting the substrate W. As shown in FIG. 3, in an embodiment the method comprises applying bonding material 29 to the core body 21. The bonding material 29 is applied at least to one of the main surfaces of the core body 21. The bonding material 29 is applied between the burls 22. As shown in FIG. 3, in an embodiment a plurality of discrete portions of bonding material 29 are applied to the core body 21. In an alternative embodiment, the bonding material 29 is applied substantially continuously across the main surface of the core body 21 between the burls 22. The method for dispensing the bonding material 29 is not particularly limited. By providing a plurality of discrete portions of bonding material 29, the overall volume of the bonding material 29 may be reduced. This reduces the possibility of excess bonding material 29 being present near the burls 22 which may otherwise adversely influence the clamping function of the substrate holder 20.

As shown in FIG. 4, in an embodiment the method comprises connecting an electrostatic sheet 25 to a plate 30 of a tool. The plate 30 comprises a plurality of recesses 31 for respective burls 22 of the core body 21. The recesses 31 line up with respective holes 34 of the electrostatic sheet 25. In an embodiment, the centres of the recesses 31 align with the centres of the holes 34 in the electrostatic sheet 25. The plate 30 is configured such that the pattern of recesses 31 corresponds to the pattern of burls 22 of the core body 21. Accordingly, the disclosure provided above regarding the number and the positioning of the burls 22 applies equally to the number and positioning of the recesses 31 of the plate 30, as well as to the holes 34 of the electrostatic sheet 25. In an embodiment, in a direction perpendicular to a plane of the plate 30, the plate 30 has a stiffness of at most $10^5$ Nm$^{-1}$. The plate 30 is configured to be compliant to follow variations in the heights of the burls 22.

The way that the plate 30 is connected to the electrostatic sheet 25 is not particularly limited. For example, the connection between the plate 30 and the electrostatic sheet 25 may be by means of a vacuum and/or electrostatic attraction and/or temporary bonding. In an embodiment, the plate 30 is positioned with respect to the core body 21, for example using a positioner. The positioner is configured to control movement of the plate 30 when the electrostatic sheet 25 is connected. The positioner positions the plate 30 relative to the core body 21 such that the recesses 31 of the plate 30 (and hence also the holes 34 of the electrostatic sheet 25) are aligned with the burls 22 of the core body 21.

The positioner is configured to control movement of the plate 30 so as to mount the electrostatic sheet 25 onto the core body 21 between the burls 22. For example, the positioner may lower the plate 30 downwards onto the core body 21. In an alternative embodiment, the positioner is configured to move the core body 21 upwards towards the plate 30 such that the burls 22 extend through the holes 34 of the electrostatic sheet 25.

During the mounting process, the distal ends 23 of the burls 22 come into contact with the base of the recesses 31. The base of the recesses 31 stops the electrostatic sheet 25 and the core body 21 from moving closer to each other. The depth of the recesses 31 determines the height at which the electrostatic sheet 25 is mounted. The depth of the recesses 31 controls the distance between the bottom of the electrostatic sheet 25 and the upper surface of the core body 21 (where the bonding material 29 is positioned). The depths of the recesses 31 controls the height that the burls 22 protrude above the upper surface of the electrostatic sheet 25 in the manufactured substrate holder 20.

In an embodiment, the recesses 31 have a depth that corresponds to the projected distance of the burls 22 mentioned above. For example, the recesses 31 have a depth of about 1 μm to about 5 mm, desirably from about 5 μm to about 250 μm.

In an embodiment, the method of manufacturing the substrate holder 20 comprises a step of curing the bonding material 29. In an embodiment, the bonding material 29 is cured under vacuum. This helps to avoid inclusions in the bonding material 29. However, it is not essential for the bonding material 29 to be cured. In an alternative embodiment, the bonding material 29 does not need to be cured.

The type of bonding material used is not particularly limited. In an embodiment the bonding material 29 comprises an adhesive material. However, it is not essential for the bonding material 29 to be an adhesive material. Non-adhesive materials can also be used. For example, in an alternative embodiment, the bonding material 29 is a material used in soldering or welding the electrostatic sheet 25 to the core body 21.

FIG. 5 schematically shows the moment when the distal ends 23 of the burls 22 abut against the base of the recesses 31.

In an embodiment, the bonding material 29 fixes the electrostatic sheet 25 to the core body 21 at the height defined by the recesses 31 of the plate 30. In an embodiment, the method comprises disconnecting the plate 30 from the electrostatic sheet 25. As shown in FIG. 2, in an embodiment the electrostatic sheet 25 is provided on each side of the core body 21. The method steps described above may be repeated for the opposite surface of the core body 21 so that an electrostatic sheet 25 is provided on both surfaces of the core body 21.

In an embodiment, at least one of the burls 22 has a stiffness of at most $10^7$ $Nm^{-1}$ at its distal end 23 in a direction within the support plane 24. In normal use of the substrate holder 20, a direction within the support plane 24 is horizontal. The stiffness in a direction within the support plane 24 may be referred to as the horizontal stiffness. The horizontal stiffness refers to the amount of force required to be applied to the distal end 23 of the burl 22 in order to move the distal end 23 horizontally. For example, a horizontal stiffness of $10^7$ $Nm^{-1}$ means that a force of 10 N applied horizontally at the distal end 23 would cause the distal end 23 to move 1 μm horizontally. By providing that the horizontal stiffness is at most $10^7$ $Nm^{-1}$, the horizontal stiffness is less than that of a known substrate holder in which an electrode is embedded in glass (rather than forming the electrostatic sheet 25 separately from the core body 21 that has the burls 22). By providing that the burls 22 extend through the holes 34 of the electrostatic sheet 25, the burls 22 are longer (in the vertical direction) than the thickness of the electrostatic sheet 25. By providing longer burls 22, the horizontal stiffness of the burls 22 can be reduced. In an embodiment, most of the burls 22 have a stiffness of at most $10^7$ $Nm^{-1}$. In an embodiment, substantially all of the burls 22 have a stiffness of at most $10^7$ $Nm^{-1}$ at their distal ends 23 in a direction within the support plane 24. The horizontal stiffness of the burls 22 can be controlled by selecting the length of the burls 22. Additionally or alternatively, the horizontal stiffness of the burls 22 can be controlled by selecting the width (i.e. girth) of the burls 22.

By reducing the horizontal stiffness of the burls 22, the burls 22 are more flexible in the direction of thermal expansion of the substrate W during exposure. During an exposure process, the substrate W is heated by radiation. The heating of the substrate W causes the substrate W to expand locally. The amount of expansion varies across the substrate W. The expansion of the substrate W can cause parts of the underside of the substrate W to slip relative to the distal ends 23 of some of the burls 22. Such slipping can cause undesirable overlay errors, which can be difficult to predict (and hence difficult to compensate for). By reducing the horizontal stiffness of the burls 22, the possibility of the substrate W slipping relative to the burls 22 is reduced. The expansion of the substrate W imparts a horizontal force on the distal ends 23 of the burls 22. The burls 22 can flex so as to maintain contact with the substrate W. The burls 22 can act as a cantilever beam.

In an embodiment, at least one (or most or all) of the burls 22 has a horizontal stiffness of at most $7 \times 10^6$ $Nm^{-1}$, optionally at most $5 \times 10^6$ $Nm^{-1}$, optionally at most $3 \times 10^6$ $Nm^{-1}$, optionally at most $2 \times 10^6$ $Nm^{-1}$, and optionally at most $10^6$ $Nm^{-1}$ at its distal end 23. By reducing the horizontal stiffness of the burls 22, the variation in contact stiffness of the burls 22 across the substrate holder 22 is desirably reduced.

In an embodiment, at least one (or most or all) of the burls 22 has a horizontal stiffness of at least $10^5$ $Nm^{-1}$, optionally at least $2 \times 10^5$ $Nm^{-1}$, optionally at least $5 \times 10^5$ $Nm^{-1}$, and optionally at least $10^6$ $Nm^{-1}$ at its distal end 23. This provides a minimum robustness to the burls 22.

In an embodiment, the core body 21 including the burls 22 is made of a material that has a high Young's modulus. For example, SiSiC has a high Young's modulus. In an embodiment, the burls 22 have a vertical stiffness of at least $10^7$ $Nm^{-1}$, optionally at least $2 \times 10^7$ $Nm^{-1}$, and optionally at least $3 \times 10^7$ $Nm^{-1}$. For example, the vertical stiffness may be about $3.4 \times 10^7$ $Nm^{-1}$. By increasing the vertical stiffness, focus performance can be improved.

The method of manufacturing the core body 21 comprising the burls 22 is not particularly limited. For example, laser ablation, electrical discharge machining and/or powder blasting may be used to produce the burls 22.

Figure 6:
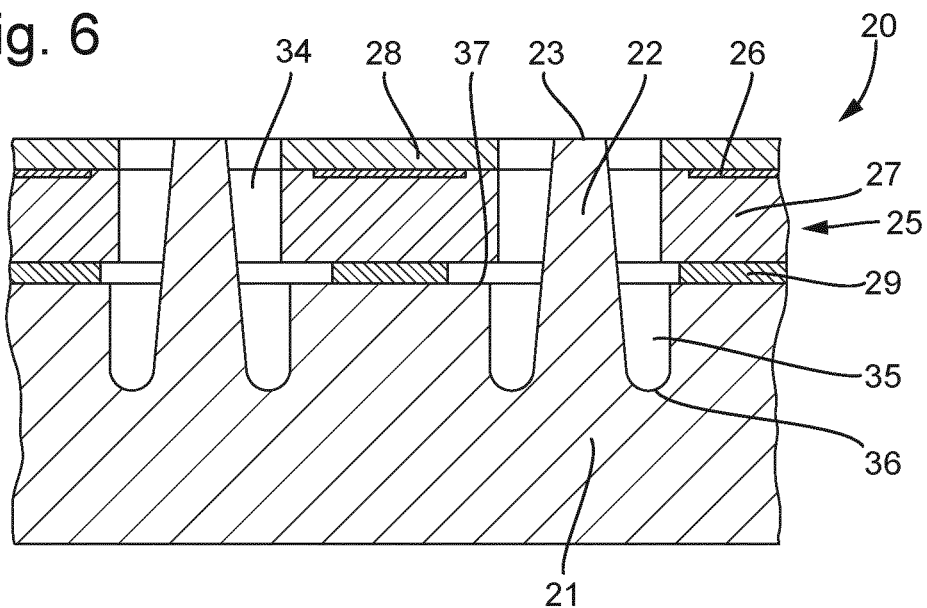
FIG. 6 is a close-up view of part of an object holder according to an embodiment of the invention.

FIG. 6 is a close-up view of part of a substrate holder 20 according to an embodiment of the invention. As shown in FIG. 6, in an embodiment at least one of the burls 22 is surrounded by a trench 35. The trench 35 is formed in the object-facing surface 37 of the core body 21. In an embodiment, the burl 22 is immediately surrounded by the trench 35. By providing the trench 35, the length of the burl 22 is increased without having to increase the thickness of the electrostatic sheet 25 or the height that the distal end 23 of the burl 22 protrudes above the top surface of the electrostatic sheet 25. By increasing the length of the burl 22, the horizontal stiffness of the burl 22 can be reduced. The length of the burl 22 is the vertical distance between the distal end 23 and the trench floor 36. The depth of the trench 35 is the vertical distance between the trench floor 36 and the object-facing surface 37 of the core body 21. The object-facing surface 37 of the core body 21 is the surface on which the bonding material 29 is positioned.

The diameter of the distal end 23 of the burls 22 is not particularly limited. In an embodiment, the diameter of the distal end 23 is at least 100 μm, and optionally at least 200 μm. In an embodiment, the diameter at the distal end 23 is at most 500 μm. For example, in an embodiment the diameter at the distal end 23 is about 210 μm. The length of the burl 22 is not particularly limited. In an embodiment, the length of the burls 22 is at least 200 μm, optionally at least 500 μm and optionally at least 1000 μm. In an embodiment the length of the burls 22 is at most 2000 μm, and optionally at most 1000 μm. For example, in an embodiment the burls 22 that are not surrounded by a trench 35 have a length of about 560 μm. In an embodiment, burls 22 that are surrounded by a trench 35 have a length of about 1000 μm. In an embodiment, the core body 21 comprises at least one burl 22 that is surrounded by a trench 35 and at least one burl 22 that is not surrounded by any such trench. There may be a mixture of burls 22 that are surrounded by trenches 35 and burls 22 that are not surrounded by trenches.

Figure 7:
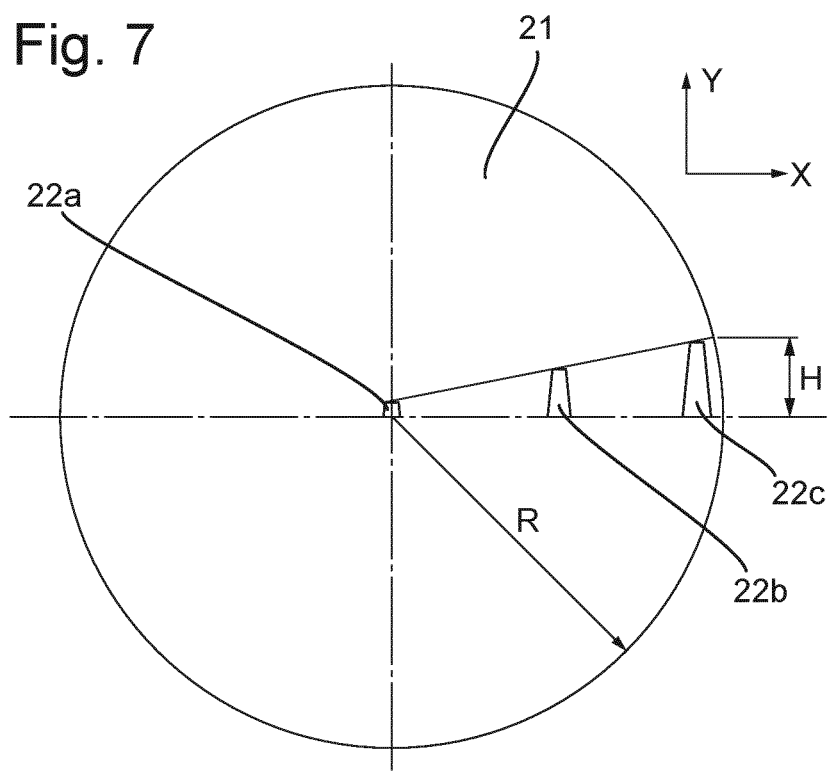
FIG. 7 is a diagram representing a variation in burls at different positions of a core body of an object holder according to an embodiment of the invention.

FIG. 7 is a schematic diagram showing how the horizontal stiffness of the burls 22 may vary depending on their position in the substrate holder 20. In an embodiment, at least one of the burls 22c in peripheral region of the substrate holder 20 has a lower horizontal stiffness than that of at least one of the burls 22a in a central region of the substrate holder 20. In an embodiment, the horizontal stiffness of the burls 22 gradually increases in the radial direction are away from the centre of the substrate holder 20. As mentioned above, there are different ways of controlling the horizontal stiffness of the burls 22. FIG. 7 schematically shows the horizontal stiffness being varied by vary the length of the burls 22. For example, as shown in FIG. 7, in an embodiment the length H of the burls 22 increases with increasing distance R from the centre of the substrate holder 20. Additionally or alternatively, the depth of the trenches 35 surrounding the burls 22 may increase with increasing distance R from the centre of the substrate holder 20. Additionally or alternatively, the width of the burls 22 may decrease with increasing distance R from the centre of the substrate holder 20. As shown in FIG. 7, in an embodiment intermediate burls 22b may have an intermediate height less than the height of the peripheral burls 22c greater than the length of the central burls 22a.

When the substrate W expands with respect to the core body 21, the relative movement of the substrate W varies depending on the radial position of the substrate W. In general, it may be expected that the relative movement between the substrate W and the core body 21 may be greatest at the periphery, while at a minimum in the centre of the substrate holder 20. This means that the risk of the substrate W slipping relative to the distal ends 23 of the burls 22 is greater in the peripheral region of the substrate holder 20. By varying the horizontal stiffness of the burls 22 depending on the radial position, the burls 22 can be made as flexible as needed for their position. This allows to balance the benefits of the flexible burls with the complexity of manufacturing the core body 21. For example, it may be more difficult to manufacture a burl 22 having lower horizontal thickness. The complexity of manufacturing the core body 21 may be increased and it may need to be necessary to reduce the possibility of slipping between the substrate W and the substrate holder 20.

Figure 8:
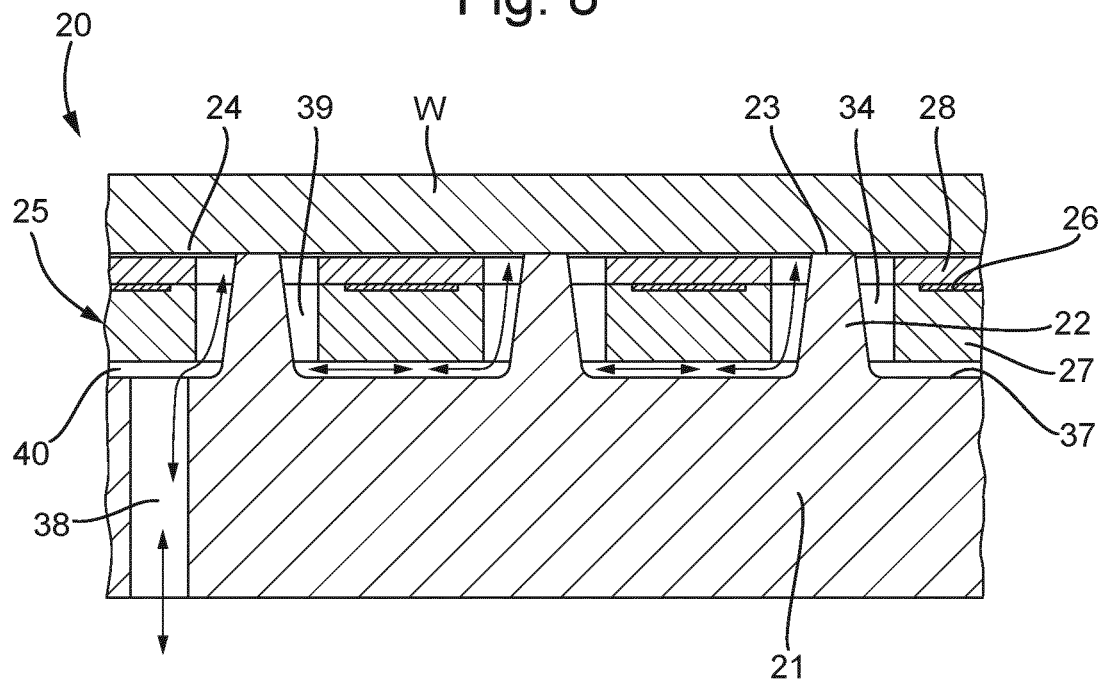
FIG. 8 is a close-up view of part of an object holder according to an embodiment of the invention.
Figure 9:
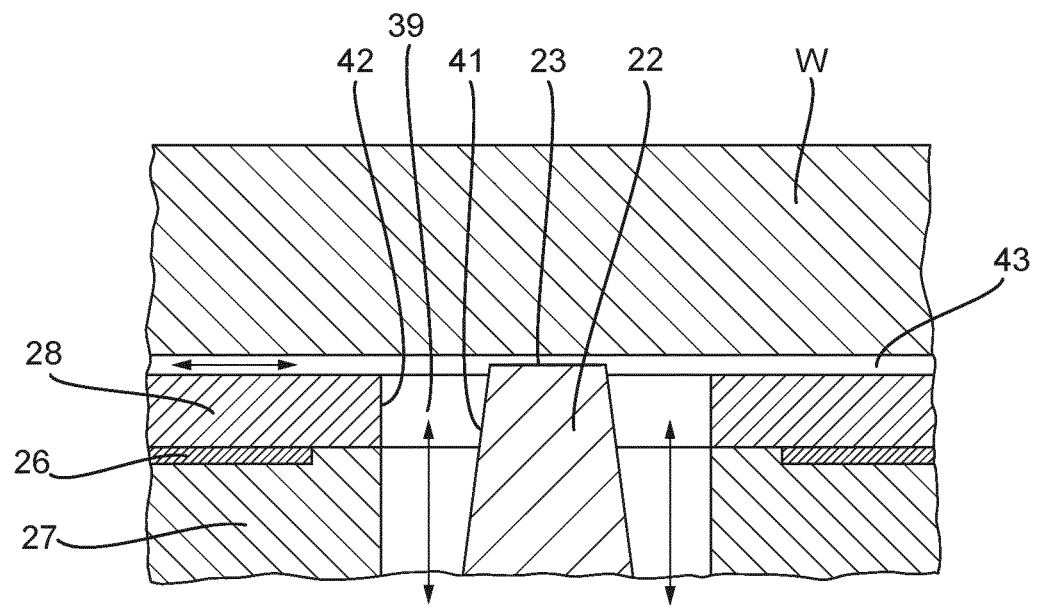
FIG. 9 is a zoomed in view of part of the object holder shown in FIG. 8.

FIG. 8 is a close-up view of part of a substrate holder 20 according to an embodiment of the invention. As shown in FIG. 8, in an embodiment the core body 21 comprises at least one gas supply passageway 38. The gas supply passageway 38 is configured to supply gas to the radial gap 39 between the radially outer surface 41 (shown in FIG. 9) of at least one of the burls 22 and the electrostatic sheet 25 via a vertical gap 40 between the core body 21 and the electrostatic sheet 25. FIG. 9 is a close-up view of the radial gap 39 between the radially outer surface 41 of the burl 22 and the wall 42 of the electrostatic sheet 25 that defines the holes 34 in the electrostatic sheet 25. In FIGS. 8 and 9, the double ended arrows represent flow of gas.

In an embodiment, the substrate holder 20 comprises a thermal conditioner configured to thermally condition the substrate W. The thermal conditioner can be used to control the temperature of the substrate W, for example during an exposure process. In an embodiment the thermal conditioner comprises a circuit through which thermal conditioning fluid flows. In an embodiment the thermal conditioner comprises heaters and sensors controlled to control the thermal conditioning function.

By providing the gas supply passageway 38, gas can be supplied between the substrate W and the substrate holder 20 so as to increase heat transfer between the substrate holder 20 and the substrate W. This helps with controlling the temperature of the substrate W. As shown in FIG. 8, the gas is supplied through the gas supply passageway 38 directly under the electrostatic sheet 25. The gas supply passageway 38 terminates at an opening in the object-facing surface 37 of the core body 21 directly below the electrostatic sheet 25. The gas flows in the vertical gap 40 between the core body 21 and the electrostatic sheet 25 and reaches the radial gap 39. The gas then fills the gap between the substrate W and the top surface of the electrostatic sheet 25, thereby improving thermal conduction between the substrate W and the substrate holder 20.

By providing the gas supply passageways 38 directly below the electrostatic sheet 25, flatness of the substrate W can be improved. This is because the gas pathways between the core body 21 and the lower dielectric layer 27 of the electrostatic sheet 25 allow the gas to reach below the substrate W without requiring a hole in the electrostatic sheet 25 in that location. By not having a hole in the electrostatic sheet 25, it is not necessary to have a hole in the high voltage electrode 26. By not having a hole in the high voltage electrode 26, it is not necessary to have a grounding layer in the hole to shield the electrode 26. By not having a hole in the high voltage electrode 26, there is no local reduction in the electrostatic clamping force which would otherwise reduce flatness. The electrostatic sheet 25 is positioned between the gas supply passageway 38 and the substrate W. In an embodiment, a plurality of such gas supply passageways 38 are provided across the core body 21. There is no particular restriction on the position and number of the gas supply passageways 38. An embodiment of the invention is expected to improve uniformity of pressure below the substrate W, without unduly reducing the flatness of the substrate W. The vertical gap 40 is present in regions between the portions of bonding material 29. By increasing the uniformity of the pressure below the substrate W, the mean pressure can be reduced without unduly increasing the possibility of the pressure being too low below parts of the substrate W. By reducing the mean pressure below the substrate W, the effective clamping force holding the substrate W on the substrate holder 20 is increased. The release time for the gas can be decreased. The type of gas used is not particularly limited. In an embodiment, the gas comprises hydrogen. In an embodiment the electrostatic sheet 25 comprises holes directly vertically above the gas supply passageway 38.

FIG. 10 is a close-up view of parts of a substrate holder 20 according to an embodiment of the invention. As shown in FIG. 10, in an embodiment the bonding material 29 substantially fills the region between the lower surface of the electrostatic sheet 25 and the facing surface of the core body 21. As shown in FIG. 10, in an embodiment the bonding material 29 substantially covers the object-facing surface 37 of the core body 21 below the electrostatic sheet 25. As shown in FIG. 10, in an embodiment the bonding material 29 surrounds the burl 22. As shown in FIG. 10, in an embodiment the bonding material 29 has an upper surface which is lower than the upper surface of the electrostatic sheet 25. In an alternative embodiment, the upper surface of the bonding material 29 is substantially coplanar with the upper surface of the electrostatic sheet 25. The embodiment shown in FIG. 10 is in contrast to other embodiments described above in which the bonding material 29 is provided in sparse locations (rather than all around the electrostatic sheet 25).

In an embodiment the electrode 26 is connected to a high voltage potential (e.g. about 3200 kV). The electric field arising between the substrate W and the electrostatic sheet 25 results in an electrostatic attraction force between the substrate holder 20 and the substrate W. In an embodiment, the core body 26 and its burls 22 are electrically grounded (or kept at another controlled potential). There is an electric field present in the region between the electrostatic sheet 25 and the burls 22, as well as in the region between the electrostatic sheet 25 and the core body 21. There is an electric field present in the bonding material 29.

As shown in FIG. 10, in an embodiment the electrostatic sheet 25 comprises an electrical insulator 44. The electrical insulator 44 is non-conductive and functions as a high voltage barrier. The electrical insulator 44 surrounds the electrode 26 in the plane of the electrode 26. The electrical insulator 44 reduces the possibility of electrical breakdown between the electrode 26 and the burl 22.

Charge can flow across the electrical insulator 44. This can undesirably affect the clamping force when the electrode 26 is at a high voltage. The flow of charge can also undesirably lead to a residual clamping force when the substrate holder 20 is not used to clamp the substrate W. In an embodiment in which the bonding material 29 is all around the electrostatic sheet 25 (e.g. as shown in FIG. 10), the surface conductivity of the bonding material 29 can undesirably impact the electrostatic field and the clamping force.

FIG. 11 is a close-up view of part of a substrate holder 20 according to an embodiment of the invention. The arrows indicate the electric field. As shown in FIG. 11, in an embodiment the electrostatic sheet 25 comprises electrostatic shielding 45. The electrostatic shielding 45 is configured to isolate the electrostatic sheet 25 from other components. In an embodiment the electrostatic shielding 45 is configured to shield charges in the electrical insulator 44 from the substrate W and/or from the rest of the core body 21 and burls 22. The electrostatic shielding 45 may be provided in one or more different positions around the electrostatic sheet 25. In an embodiment, the electrostatic shielding 45 comprises electrically conductive plating at the surface of the electrostatic sheet 25. In an embodiment, the electrostatic shielding 45 is applied by chemical vapour deposition. In an embodiment, the electrostatic shielding 45 is applied by sputtering. In an embodiment, the electrostatic shielding 45 is applied by physical vapour deposition. In an embodiment the electrostatic shielding 45 has a thickness of at least 50 nm, optionally at least 100 nm, optionally at least 200 nm and optionally at least 500 nm. In an embodiment the electrostatic shielding 45 has a thickness of at most 1000 nm, optionally at most 500 nm, optionally at most 200 nm and optionally at most 100 nm. In an embodiment the thickness of the electrostatic shielding 45 may be different for different sections of the electrostatic shielding.

FIG. 12 is a schematic cross-sectional view of part of the electrostatic sheet 25 according to an embodiment of the invention. As shown in FIG. 12, in an embodiment the electrostatic sheet 25 comprises electrostatic shielding 45a at the main surface of the electrostatic sheet 25 facing the core body 21. In the example shown in FIG. 11, this is the bottom surface of the electrostatic sheet 25. The electrostatic shielding 45a is configured to isolate the electrode 26 from the object-facing surface 37 of the core body 21. In an embodiment, the electrostatic shielding 45a covers substantially all of the bottom surface of the electrostatic sheet 25. However, this is not necessarily the case. In an alternative embodiment, the electrostatic shielding 45a covers only part of the bottom surface of the electrostatic sheet 25.

As shown in FIG. 12, in an embodiment the electrostatic sheet 25 comprises electrostatic shielding 45b at the hole-defining surface of the electrostatic sheet 25. The electrostatic shielding 45b is configured to isolate the electrostatic sheet 25 from the radially outer surface 41 of at least one of the burls 22. As shown in FIG. 12, in an embodiment the electrostatic sheet 25 comprises electrostatic shielding 45c at the main surface of the electrostatic sheet 25 facing away from the core body 21. In the example shown in FIG. 11, this is the top surface of the electrostatic sheet 25. The electrostatic shielding 45c is configured to at least partially isolate the electrostatic sheet 25 from a region of the substrate W vertically above the electrical insulator 44. In an embodiment, the electrostatic shielding is electrically grounded (or kept at another controlled potential). The electrostatic shielding 45 can be present in several locations. In an embodiment, the electrostatic shielding 45c is provided as a ring on top of the electrostatic sheet 25 around the holes 34 in the electrostatic sheet 25. In an embodiment, the different sections of electrostatic shielding 45a, 45b, 45c have different thicknesses.

Figure 13:
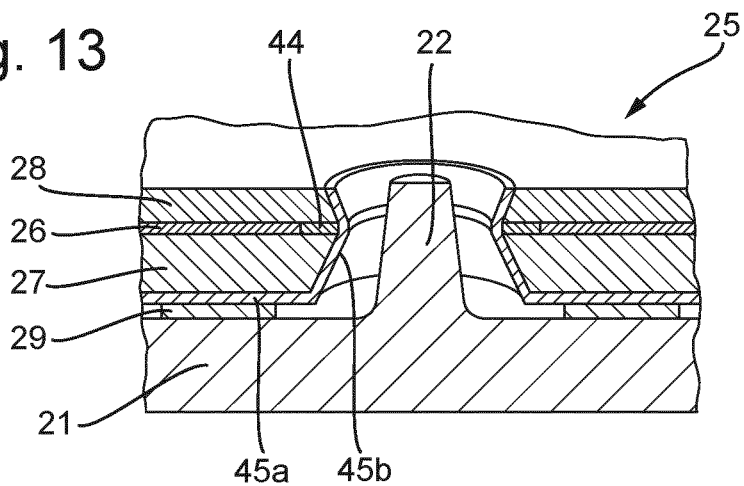
FIGS. 13-17 and 19 are close-up views of alternative arrangements of an object holder according to an embodiment of the invention.
Figure 19:
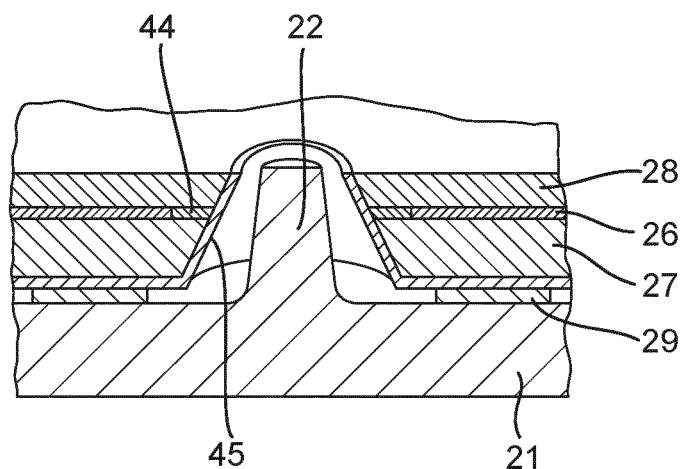

As shown in FIG. 11, for example, in an embodiment the holes 34 in the electrostatic sheet 25 are substantially cylindrical. However, this is not necessarily the case. FIGS. 13 to 17 are schematic diagrams of alternative embodiments in which the holes 34 are not completely cylindrical. For example, as shown in FIG. 13 in an embodiment the holes 34 are hourglass shaped. This may be easier to manufacture, particularly if powder blasting is used to shape the dielectric layer 27, 28. In an embodiment, the electrostatic sheet 25 comprises an upper dielectric layer 28 between the electrode 26 and the substrate W. The upper dielectric layer 28 tapers towards the substrate W. this means that the holes 34 increases in diameter towards the substrate W across the thickness of the upper dielectric layer 28. As shown in FIG. 13, in an embodiment the electrostatic sheet 25 comprises a lower dielectric layer 27. The lower dielectric layer 27 is between the electrode 26 and the core body 21. In an embodiment, the lower dielectric layer tapers towards the core body 21. This means that the diameter of the holes 34 increases towards the core body 21 across the thickness of the lower dielectric layer 27. An embodiment of the invention with hourglass shaped walls 34 is expected to be easier to manufacture. In FIG. 13, both the upper dielectric layer 28 and the lower dielectric layer 27 are tapered. In an alternative embodiment, only one of the two dielectric layers 27, 28 is tapered. In FIG. 13, the dielectric layers 27, 28 are tapered from both sides of the electrostatic sheet 25. As shown in FIG. 19, in an alternative embodiment, the electrostatic sheet 25 is tapered from only one side. For example, both the upper dielectric layer 28 and the lower dielectric layer 27 may taper towards the substrate W. Alternatively, both the upper dielectric layer 28 and the lower dielectric layer 27 may taper towards the core body 21. In an embodiment, the holes 34 are formed in the electrostatic sheet 25 by powder blasting from only one side.

As shown in FIGS. 13 to 16, the choice of where the electrostatic shielding 45 is provided is not particularly limited. As shown in FIG. 13, in an embodiment the electrostatic shielding 45 is provided at the bottom surface of the electrostatic sheet 25 and inside the holes 34 but not on top of the electrostatic sheet 25.

Figure 14:
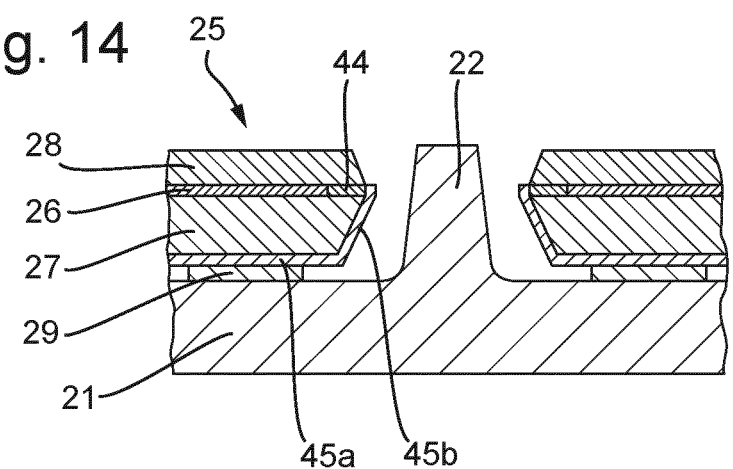

As shown in FIG. 14, in an embodiment the electrostatic shielding 45 is provided between at least one of the burls 22 and only one of the two dielectric layers 27, 28 that sandwich the electrode 26. For example, as shown in FIG. 14, in an embodiment the electrostatic shielding is provided at the bottom surface of the electrostatic sheet 25 and inside the holes 34 at the lower dielectric layer 27 (but not at the upper dielectric layer 28).

Figure 15:
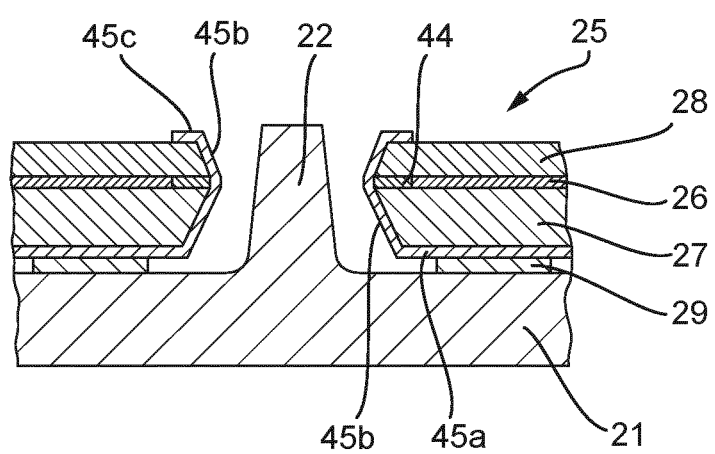

As shown in FIG. 15, in an embodiment 22, in an embodiment, the electrostatic shielding 45 is provided at the bottom surface of the electrostatic sheet 25, inside the holes 34 and at the top of the electrostatic sheet 25 around the holes 34.

By providing the electrostatic shielding 45, the possibility of undesirable electrical breakdown is reduced. This is particularly important when the size of the gaps between the electrode 26 and the burls 22 may not be well controlled because of manufacturing tolerances. The electrostatic shielding 45 helps to reduce electrical breakdown that may be caused due to charges flowing through the electrical insulator 44 or through the dielectric layers 27, 28. When the bonding material 29 is provided all around the electrostatic sheet 25 (for example as shown in FIG. 10), the electrode magnetic shielding 45 reduces the possibility of electrical breakdown as a result of surface conductivity of the bonding materials 29. The electrostatic shielding 45 reduces the possibility of undesirable electrostatic discharge across the gaps around the electrostatic sheet 25 that may be caused by materials entering those gaps.

Figure 16:
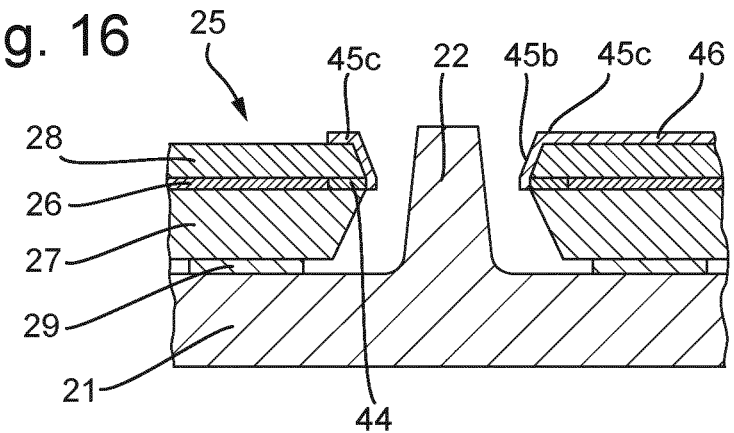

As shown in FIG. 16, in an embodiment electrostatic shielding 45b is provided inside the holes 34 only for the upper dielectric layer 28 (but not for the lower dielectric layer 27) and on top of the electrostatic sheet 25 around the holes 34.

Figure 17:
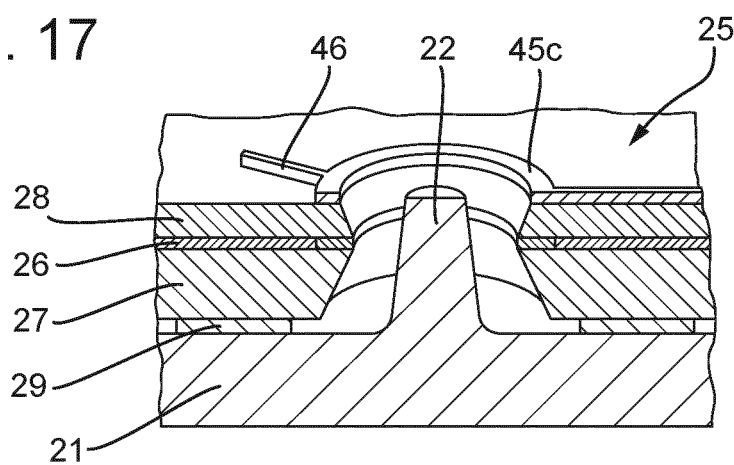

FIG. 17 schematically shows a perspective view of part of the substrate holder 20 according to an embodiment of the invention. As shown in FIG. 17, in an embodiment the electrostatic shielding 45c surrounding different burls 22 are electrically connected to each other via conductive lines 46 (also shown in FIG. 16) on the object-facing surface of the upper dielectric layer 28 of the electrostatic sheet 25 that is between the electrode 26 and the substrate W. In an embodiment, the conductive lines 46 connect the electrostatic shielding 45c around the holes 34 to ground (or another controlled potential). Accordingly, it is not necessary for the electrostatic shielding 45a at the bottom surface of the electrostatic sheet 25 to be provided in order to connect the electrostatic shielding 45c to ground.

Figure 18:
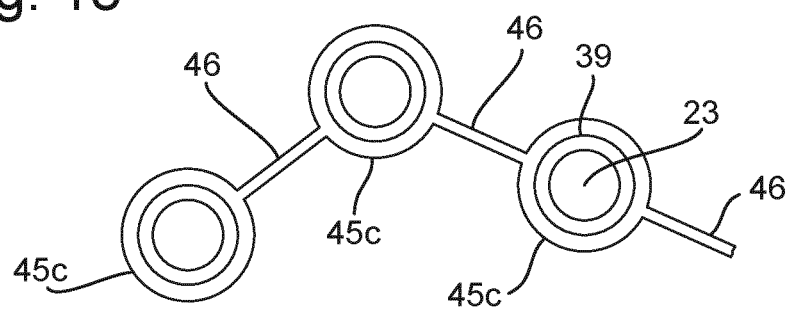
FIG. 18 is a plan view of connections between electrostatic shielding of an electrostatic sheet of an object holder according to an embodiment of the invention.

FIG. 18 is a schematic plan view of the electrostatic shielding 45c surrounding the distal ends 23 of the burls 22 connected by the conductive lines 46. The electrostatic shielding 45c may appear as doughnuts electrically connected to ground by thin conductive lines 46 on top of the electrostatic sheet 25.

The materials used to make all of the parts of an object holder according to embodiments may be any of the known materials used to manufacture known object holders. In particular, parts of the object holder according to embodiments may be manufactured with materials as disclosed in WO2015/120923A1, WO2014/154428A2 and US2013/0094009A1, the entire contents of which are incorporated herein by reference.

In particular, the metal used for the electrodes 26 may be Cr or Ti. The metal used on the distal end surfaces of the burls may be CrN or TiN. The insulating parts may be chrome oxide. The core body may be SiSiC. The material used for the electrostatic shielding 45 may be Cr, CrN or W (although many other materials are possible).

To aid clear explanation, embodiments have been described with reference to upper and lower surfaces of an object holder. The upper and lower surfaces are first and second surfaces of the object holder. The first surface is a surface to which an object may be clamped to. The second surface is a surface that a table may be clamped to. When the object holder is orientated in a horizontal plane, the first surface is an upper surface and the second surface is a lower surface. However, embodiments also include the object holder not being orientated in a horizontal plane.

Embodiments include the object holder being used in any lithographic apparatus. The lithographic apparatus may include any apparatus used in substrate manufacture, testing and inspection, such as an electron-beam inspection apparatus. To aid clear explanation, features of the object holder have been described primarily in the context of the upper side of a substrate holder 20 clamping to a substrate W. The features of the invention are equally applicable to the lower side of the object holder, for example the lower surface of a substrate holder 20 clamping to the rest of the substrate table WT. Merely as example, the features relating to the flexible burls 22, the trench 35 and the mounting tool may be applied at the lower side of a substrate holder 20.

Embodiments are provided according to the following clauses:

1. An object holder configured to support an object, the object holder comprising:
    a core body comprising a plurality of burls having distal ends in a support plane for supporting the object; and
    an electrostatic sheet between the burls, the electrostatic sheet comprising an electrode sandwiched between dielectric layers;
    wherein the electrostatic sheet is bonded to the core body by a bonding material having a thickness of at least 100 nm.

2. The object holder of clause 1, wherein at least one of the burls has a stiffness of $10^5$-$10^7$ $Nm^{-1}$ at its distal end in a direction within the support plane.

3. The object holder of clause 1 or 2, wherein at least one of the burls is immediately surrounded by a trench in an object-facing surface of the core body.

4. The object holder of any preceding clause, wherein at least one of the burls in a peripheral region of the object holder has a lower stiffness at its distal end in a direction within the support plane than that of at least one of the burls in a central region of the object holder.

5. The object holder of any preceding clause, wherein the core body comprises at least one gas supply passageway configured to supply gas to a radial gap between a radially outer surface of at least one of the burls and the electrostatic sheet via a vertical gap between the core body and the electrostatic sheet.

6. The object holder of any preceding clause, wherein the electrostatic sheet comprises electrostatic shielding configured to isolate the electrostatic sheet from at least one of a region of the object vertically above an electrical insulator surrounding the electrode in a plane of the electrode, an object-facing surface of the core body and a radially outer surface of at least one of the burls.

7. The object holder of clause 6, wherein the electrostatic shielding is provided between at least one of the burls and only one of two dielectric layers that sandwich the electrode.

8. The object holder of clause 6 or 7, wherein the electrostatic shielding surrounding different burls are electrically connected to each other via conductive lines on an object-facing surface of an upper dielectric layer of the electrostatic sheet between the electrode and the object.

9. The object holder of any preceding clause, wherein the electrostatic sheet comprises a first dielectric layer between the electrode and the object that tapers towards the object or the core body and a second dielectric layer between the electrode and the core body that tapers towards the object or the core body.

10. The object holder of any preceding clause, wherein the bonding material comprises an adhesive material.

11. A tool for mounting an electrostatic sheet comprising an electrode sandwiched between dielectric layers onto a core body comprising a plurality of burls having distal ends in a support plane for supporting an object, the tool comprising a plate comprising a plurality of recesses for respective burls, the plate configured to connect to the electrostatic sheet such that the recesses line up with respective holes in the electrostatic sheet.

12. The tool of clause 11, comprising a positioner configured to control movement of the plate when the electrostatic sheet is connected so as to mount the electrostatic sheet onto the core body between the burls, a depth of the recesses determining a height at which the electrostatic sheet is mounted.

13. The tool of clause 11 or 12, wherein in a direction perpendicular to a plane of the plate the plate has a stiffness of at most $10^5$ Nm$^{-1}$.

14. A method of manufacturing an object holder, the method comprising: providing a core body comprising a plurality of burls having distal ends in a support plane for supporting an object;
connecting an electrostatic sheet to a plate comprising a plurality of recesses for respective burls, such that the recesses line up with respective holes in the electrostatic sheet, the electrostatic sheet comprising an electrode sandwiched between dielectric layers; and
controlling movement of the plate when the electrostatic sheet is connected so as to mount the electrostatic sheet onto the core body between the burls, a depth of the recesses determining a height at which the electrostatic sheet is mounted.

15. A lithographic apparatus comprising an object holder according to any of clauses 1-10.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference may have been made above to the use of embodiments of the invention in the context of object inspection and optical lithography, it will be appreciated that the invention, where the context allows, is not limited to these contexts and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An object holder configured to support an object, the object holder comprising:
a core body comprising a plurality of burls having distal ends in a support plane for supporting the object, the burls not having an electrode therein configured to provide an electrostatic force; and
an electrostatic sheet between the burls, the electrostatic sheet comprising an electrode sandwiched between dielectric layers,
wherein at least one of the burls is immediately surrounded by a trench in an object-facing surface of the core body.

2. The object holder of claim 1, wherein at least one of the burls has a stiffness of $10^5$-$10^7$ Nm$^{-1}$ at its distal end in a direction within the support plane.

3. The object holder of claim 1, wherein at least one of the burls in a peripheral region of the object holder has a lower stiffness at its distal end in a direction within the support plane than that of at least one of the burls in a central region of the object holder.

4. The object holder of claim 1, wherein the core body comprises at least one gas supply passageway configured to supply gas to a gap between a radially outer surface of at least one of the burls and the electrostatic sheet via a vertical gap between the core body and the electrostatic sheet.

5. The object holder of claim 1, wherein the electrostatic sheet comprises electrostatic shielding configured to isolate the electrostatic sheet from at least one selected from: a region of the object vertically above an electrical insulator surrounding the electrode in a plane of the electrode, an object-facing surface of the core body, and/or a radially outer surface of at least one of the burls.

6. The object holder of claim 5, wherein the electrostatic shielding is provided between at least one of the burls and only one of two dielectric layers that sandwich the electrode.

7. The object holder of claim 5, wherein the electrostatic shielding surrounds different burls and the electrostatic shielding surrounding different burls are electrically connected to each other via conductive lines on an object-facing surface of an upper dielectric layer of the electrostatic sheet between the electrode and the object.

8. The object holder of claim 1, wherein the electrostatic sheet comprises a first dielectric layer between the electrode and the object that tapers towards the object or core body and a second dielectric layer between the electrode and the core body that tapers towards the object or core body.

9. The object holder of claim 1, wherein the electrostatic sheet is bonded to the core body by a bonding material having a thickness of 100 nm or less and wherein the bonding material comprises an adhesive material.

10. A lithographic apparatus comprising the object holder of claim 1.

11. An object holder configured to support an object, the object holder comprising:
a core body comprising a plurality of burls having distal ends in a support plane for supporting the object, the core body comprising at least one gas supply passageway terminating an opening in a surface of the core body; and
an electrostatic sheet between the burls, the electrostatic sheet comprising an electrode sandwiched between dielectric layers,
wherein the at least one gas supply passageway is configured to supply gas to a gap between an outer surface of at least one of the burls and the electrostatic sheet via a gap between the core body and the electrostatic sheet.

12. The object holder of claim 11, wherein at least one of the burls is immediately surrounded by a trench in an object-facing surface of the core body.

13. The object holder of claim 11, wherein at least one of the burls has a stiffness of $10^5$-$10^7$ Nm$^{-1}$ at its distal end in a direction within the support plane.

14. The object holder of claim 11, wherein at least one of the burls in a peripheral region of the object holder has a lower stiffness at its distal end in a direction within the support plane than that of at least one of the burls in a central region of the object holder.

15. The object holder of claim 11, wherein the electrostatic sheet comprises electrostatic shielding configured to isolate the electrostatic sheet from at least one selected from: a region of the object vertically above an electrical insulator surrounding the electrode in a plane of the electrode, an object-facing surface of the core body, and/or a radially outer surface of at least one of the burls.

16. An object holder configured to support an object, the object holder comprising:
- a core body comprising a plurality of burls having distal ends in a support plane for supporting the object, the core body comprising at least one gas supply passageway with an opening at a surface of the core body; and
- an electrostatic sheet between the burls, the electrostatic sheet comprising an electrode sandwiched between dielectric layers, wherein the electrostatic sheet comprises conductive electrostatic shielding configured to isolate the electrostatic sheet from at least one selected from: a region of the object vertically above an electrical insulator surrounding the electrode in a plane of the electrode, an object-facing surface of the core body, and/or a radially outer surface of at least one of the burls.

17. The object holder of claim 16, wherein the electrostatic shielding is provided between at least one of the burls and only one of two dielectric layers that sandwich the electrode.

18. The object holder of claim 16, wherein the electrostatic shielding surrounds different burls and the electrostatic shielding surrounding different burls are electrically connected to each other via conductive lines on an object-facing surface of an upper dielectric layer of the electrostatic sheet between the electrode and the object.

19. The object holder of claim 16, wherein at least one of the burls has a stiffness of $10^5$-$10^7$ Nm$^{-1}$ at its distal end in a direction within the support plane.

20. The object holder of claim 16, wherein the core body comprises at least one gas supply passageway configured to supply gas to a gap between an outer surface of at least one of the burls and the electrostatic sheet via a gap between the core body and the electrostatic sheet.

* * * * *